US006852562B1

(12) United States Patent
Hopper et al.

(10) Patent No.: US 6,852,562 B1
(45) Date of Patent: Feb. 8, 2005

(54) LOW-COST METHOD OF FORMING A COLOR IMAGER

(75) Inventors: Peter J. Hopper, San Jose, CA (US); Robert Drury, Santa Clara, CA (US); Philipp Lindorfer, San Jose, CA (US); Vladislav Vashchenko, Palo Alto, CA (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/728,612

(22) Filed: Dec. 5, 2003

(51) Int. Cl.[7] ............................................. H01L 21/00
(52) U.S. Cl. ..................................... 438/57; 438/73
(58) Field of Search ........................... 438/47–98, 584, 438/141, 237, 328

(56) References Cited

U.S. PATENT DOCUMENTS

| | | | |
|---|---|---|---|
| 4,979,002 A | * 12/1990 | Pankove | 257/85 |
| 5,151,380 A | * 9/1992 | Hynecek | 438/76 |
| 5,932,873 A | 8/1999 | Bergemont et al. | 250/208.1 |
| 5,962,844 A | 10/1999 | Merrill et al. | 250/214 A |
| 5,965,875 A | 10/1999 | Merrill | 250/226 |
| 5,970,316 A | 10/1999 | Merrill | 438/57 |
| 5,982,012 A | 11/1999 | Merrill | 257/463 |
| 6,002,432 A | 12/1999 | Merrill et al. | 348/241 |
| 6,018,365 A | 1/2000 | Merrill | 348/302 |
| 6,063,682 A | 5/2000 | Sultan et al. | 438/305 |
| 6,066,510 A | 5/2000 | Merrill | 438/57 |
| 6,088,058 A | 7/2000 | Mead et al. | 348/296 |
| 6,150,683 A | 11/2000 | Merrill et al. | 257/292 |
| 6,160,282 A | 12/2000 | Merrill | 257/292 |
| 6,211,510 B1 | 4/2001 | Merrill et al. | 250/208.1 |
| 6,215,164 B1 | * 4/2001 | Cao et al. | 257/431 |
| 6,246,043 B1 | 6/2001 | Merrill | 250/208.1 |
| 6,342,405 B1 | * 1/2002 | Major et al. | 438/46 |
| 6,368,928 B1 | 4/2002 | Wang et al. | 438/307 |
| 6,369,853 B1 | 4/2002 | Merrill et al. | 348/302 |
| 6,410,899 B1 | 6/2002 | Merrill et al. | 250/208.1 |
| 6,452,633 B1 | 9/2002 | Merrill et al. | 348/302 |
| 6,459,140 B1 | 10/2002 | Johansson et al. | 257/592 |
| 6,476,372 B2 | 11/2002 | Merrill et al. | 250/208.1 |
| 6,504,219 B1 | 1/2003 | Puchner et al. | 257/371 |
| 6,512,544 B1 | 1/2003 | Merrill et al. | 348/302 |
| 6,525,304 B1 | 2/2003 | Merrill et al. | 250/208.1 |
| 6,577,342 B1 | * 6/2003 | Wester | 348/340 |
| 6,606,120 B1 | 8/2003 | Merrill et al. | 348/273 |
| 6,632,701 B2 | 10/2003 | Merrill | 438/70 |
| 6,636,261 B1 | 10/2003 | Pritchard et al. | 348/308 |
| 6,646,318 B1 | * 11/2003 | Hopper et al. | 257/440 |
| 6,697,114 B1 | 2/2004 | Merrill | 348/308 |
| RE38,499 E | 4/2004 | Merrill et al. | 348/301 |
| 6,727,521 B2 | 4/2004 | Merrill | 257/98 |
| 6,731,397 B1 | 5/2004 | Merrill et al. | 358/1.16 |
| 6,741,283 B1 | 5/2004 | Merrill et al. | 348/308 |
| 6,760,070 B1 | 7/2004 | Merrill et al. | 348/294 |
| 2003/0230753 A1 | * 12/2003 | Steckl et al. | 257/89 |
| 2004/0012029 A1 | * 1/2004 | Bawolek et al. | 257/98 |

* cited by examiner

*Primary Examiner*—Savitri Mulpuri
(74) *Attorney, Agent, or Firm*—Law Offices of Mark C. Pickering

(57) ABSTRACT

A color imager, which has a plurality of photodiodes, utilizes a layer of metal that is formed over the photodiodes. The metal layer has a plurality of different sized openings that lie vertically over the photodiodes to physically diffract, and thereby filter, the incident light that strikes the color imager.

20 Claims, 6 Drawing Sheets

LOW-COST METHOD OF FORMING A COLOR IMAGER

BACKGROUND OF THE INVENTION

1. Field of the Invention

The present invention relates to color imagers and, more particularly, to a color imager and a low-cost method of forming the imager.

2. Description of the Related Art

A photodiode is a semiconductor device that, when exposed to electromagnetic radiation, such as light, generates electron-hole pairs at depths within the device where the electromagnetic radiation is absorbed by the device. By collecting the photo-generated electrons, a relative measure of the intensity of the electromagnetic radiation can be determined.

FIG. 1 shows a cross-sectional diagram that illustrates a prior-art photodiode 100. As shown in FIG. 1, photodiode 100 includes a lightly-doped, p-type region 110, an overlying n-type region 112, and a depletion region 114 that is formed across the pn junction of p-type region 110 and n-type region 112.

In operation, photodiode 100 is first reset by placing a reset voltage on n-type region 112 that reverse biases the pn junction. The reverse-biased voltage, which sets up an electric field across the junction, increases the width of depletion region 114 so that a predefined portion of the electromagnetic spectrum can be absorbed in depletion region 114.

Once photodiode 100 is reset, photodiode 100 is then exposed to a source of electromagnetic radiation for a period of time, known as an integration period. When photodiode 100 is struck by electromagnetic radiation during the integration period, the radiation penetrates down to an absorption depth that depends on the wavelength of the radiation.

For example, blue light has an absorption depth of approximately 0.7 microns measured down from the top surface of n-type region 112, while red light has an absorption depth of approximately 1.2 microns measured down from the top surface of n-type region 112. Green light, in turn, is absorbed at a depth that lies between blue and red light.

Photodiode 100 absorbs the different wavelengths of light at the different absorption depths and, in response, generates a number of electron-hole pairs. As a result, the radiation from the predefined portion of the electromagnetic spectrum forms a number of electron-hole pairs in depletion region 114.

The electric field set up across the reverse-biased pn junction attracts the electrons that are formed in depletion region 114 (along with the electrons that are formed in p-type region 110 within a diffusion length of depletion region 114) to n-type region 112 where each additional electron reduces the magnitude of the reset voltage that was placed on n-type region 112.

Thus, at the end of the integration period, the total number of electrons collected by n-type region 112 has reduced the reset voltage to an integrated voltage. As a result, the total number of electrons collected by n-type region 112 during the integration period, which represents the intensity of the source of the electromagnetic radiation, can be determined by subtracting the integrated voltage from the reset voltage.

A black and white imager is a device that utilizes a large number of photodiodes to generate an image that is based on the intensity information collected by each photodiode. Similarly, a color imager is a device that utilizes a large number of color photodiodes to generate an image that is based on the intensity information collected by each color photodiode.

One approach to implementing a color photodiode is to utilize a photodiode, such as photodiode 100, with a filter that lies over the photodiode. For example, a red photodiode can be formed by using a first photodiode that is covered by a red filter, while green and blue photodiodes can be formed by using second and third photodiodes, respectively, that are covered by green and blue filters, respectively.

The red filter of the first photodiode passes only red light which, in turn, allows the first photodiode to produce and collect only red photo-generated electrons. Similarly, the green filter of the second photodiode passes only green light which allows the second photodiode to produce and collect only green photo-generated electrons, and the blue filter of the third photodiode passes only blue light which allows the third photodiode to produce and collect only blue photo-generated electrons.

One drawback with this approach is that the filters are not part of a standard CMOS process flow and, as a result, substantially increase the cost of a color imager with respect to a black and white imager. As a result, there is a need for a low-cost approach to forming a color imager.

DETAILED DESCRIPTION OF THE INVENTION

Figure 1:
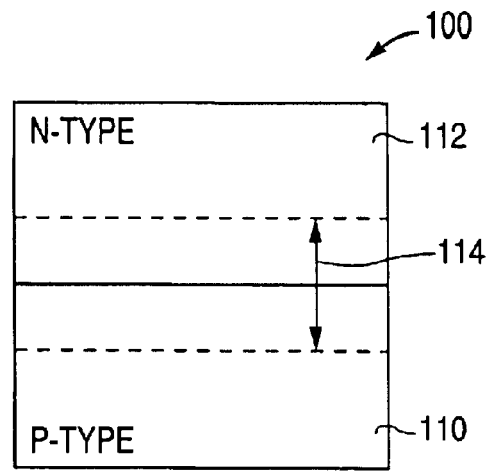
FIG. 1 is a cross-sectional diagram illustrating a prior-art photodiode 100.
Figure 2:
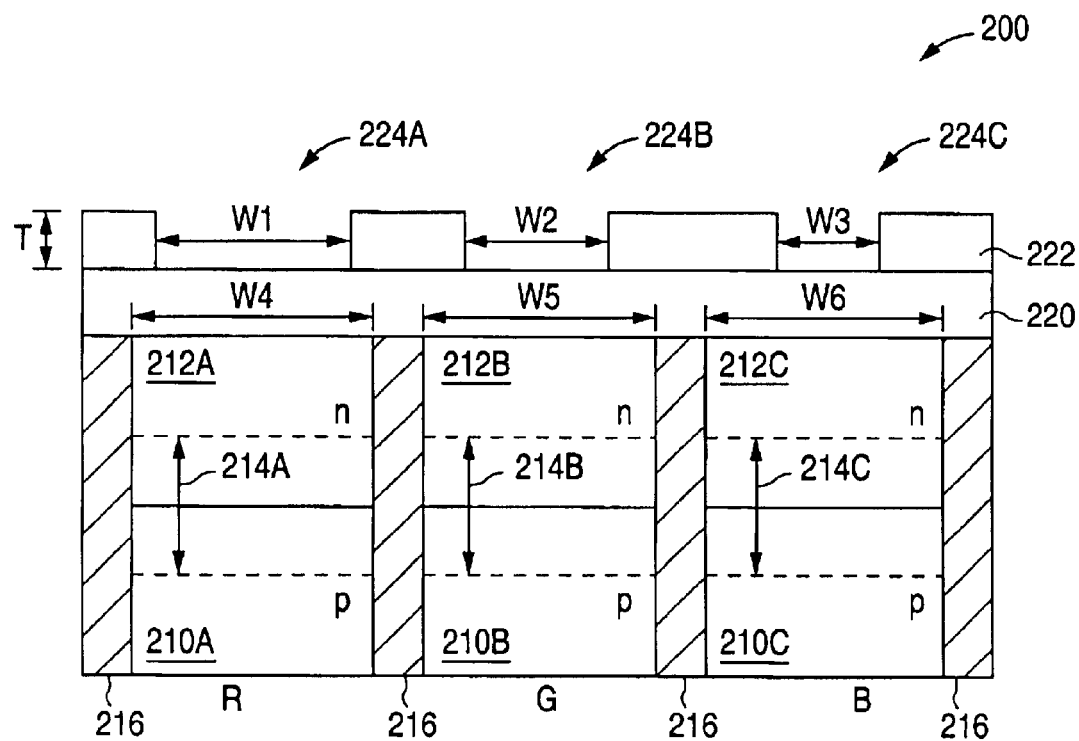
FIG. 2 is a cross-sectional diagram illustrating an example of a color imager 200 in accordance with the present invention.

FIG. 2 shows a cross-sectional view that illustrates an example of a color imager 200 in accordance with the present invention. As described in greater detail below, color imager 200 utilizes different sized openings in a metal layer to physically diffract, and thereby filter, the incident light.

As shown in FIG. 2, imager 200 includes a lightly-doped, p-type region that has a first p-type region 210A, a second p-type region 210B, and a third p-type region 210C. Imager 200 also includes an overlying n-type region that has a first n-type region 212A that contacts p-type region 210A, a second n-type region 212B that contacts p-type region 210B, and a third n-type region 212C that contacts p-type region 210C.

In addition, imager 200 includes a first depletion region 214A that is formed across the pn junction of p-type region 210A and n-type region 212A, a second depletion region 214B that is formed across the pn junction of p-type region 210B and n-type region 212B, and a third depletion region 214C that is formed across the pn junction of p-type region 210C and n-type region 212C.

Further, imager 200 includes a number of trench isolation regions 216 that are formed between, and isolate, the first p-type and n-type regions 210A and 212A, the second p-type and type regions 210B and 212B, and the third p-type and n-type regions 210C and 212C from each other.

Imager 200 also includes a layer of isolation material 220 that is formed on n-type regions 212A, 212B, and 212C, and a layer of metal 222 that is formed on isolation material 220. In accordance with the present invention, metal layer 222 includes a first opening 224A that has a first width W1 approximately equal to the wavelength of a first light, such as red light, a second opening 224B that has a second width W2 approximately equal to the wavelength of a second light, such as green light, and a third opening 224C that has a third width W3 approximately equal to the wavelength of a third light, such as blue light.

First, second, and third openings 224A, 224B, and 224C ideally have a round shape when seen from a plan view, where the widths W1, W2, and W3 are diameters. Alternately, first, second, and third openings 224A, 224B, and 224C can have a square shape when seen from a plan view. Least desirable is a rectangular-shaped opening unless polarized light is desired.

In addition, metal layer 222 has a thickness T and n-type regions 212A, 212B, and 212C have widths W4, W5, and W6, respectively, that are sufficient to prevent incident light, which is non-normal to the top surface of metal layer 222, from passing through the opening of one color and being picked up by the depletion region that lies vertically below the opening of another color.

For example, metal layer 222 has a thickness T and widths W4, W5, and W6 such that red photons passing through first opening 224A that are non-normal to the top surface of metal layer 222 are not absorbed by depletion region 214B that lies below second opening 224B (or depletion region 214C that lies below third opening 224C if positioned adjacent to first opening 224A.

In operation, color imager 200 is first reset by placing reset voltages on the n-type regions 212A, 212B, and 212C that reverse bias the pn junctions. The reverse-biased voltages, which set up electric fields across the junctions, increase the widths of the depletion regions 214A, 214B, and 214C so that a predefined portion of the electromagnetic spectrum can be absorbed in the depletion regions 214A, 214B, and 214C.

Once imager 200 has been reset, imager 200 is then exposed to a source of electromagnetic radiation for an integration period. When exposed to electromagnetic radiation, the first light and light with shorter wavelengths, such as red, green, and blue light, pass through opening 224A. The light is absorbed in depletion region 214A which, in turn, generates a number of electron-hole pairs.

The electric field set up across the reverse-biased pn junction attracts the electrons that are formed in depletion region 214A (along with the electrons that are formed in p-type region 210A within a diffusion length of depletion region 214A) to n-type region 212A where each additional electron reduces the magnitude of the reset voltage that was placed on n-type region 212A.

At the end of the integration period, the total number of electrons collected by n-type region 212A has reduced the reset voltage to an integrated voltage. As a result, the total number of electrons collected by n-type region 212A during the integration period, which represents the intensity of the first light and light with shorter wavelengths, such as red, green, and blue light, can be determined by subtracting the integrated voltage from the reset voltage.

The second light and light with shorter wavelengths, such as green and blue light, pass through opening 224B. The light is absorbed in depletion region 214B which, in turn, generates a number of electron-hole pairs. The electric field set up across the reverse-biased pn junction attracts the electrons that are formed in depletion region 214B (along with the electrons that are formed in p-type region 210B within a diffusion length of depletion region 214B) to n-type region 212B where each additional electron reduces the magnitude of the reset voltage that was placed on n-type region 212B.

At the end of the integration period, the total number of electrons collected by n-type region 212B has reduced the reset voltage to an integrated voltage. As a result, the total number of electrons collected by n-type region 212B during the integration period, which represents the intensity of the second light and light with shorter wavelengths, such as green and blue light, can be determined by subtracting the integrated voltage from the reset voltage.

The third light, such as blue light, and light with shorter wavelengths, such as ultraviolet (UV) light, pass through opening 224C. The blue light is absorbed in depletion region 214C which, in turn, generates a number of electron-hole pairs. Although the UV light generates electron-hole pairs, the recombination rate is very high such that the UV light makes substantially no contribution.

The electric field set up across the reverse-biased pn junction attracts the electrons that are formed in depletion region 214C (along with the electrons that are formed in p-type region 210C within a diffusion length of depletion region 214C) to n-type region 212C where each additional electron reduces the magnitude of the reset voltage that was placed on n-type region 212C.

At the end of the integration period, the total number of electrons collected by n-type region 212C has reduced the reset voltage to an integrated voltage. As a result, the total number of electrons collected by n-type region 212C during the integration period, which represents the intensity of the third light, such as blue light, can be determined by subtracting the integrated voltage from the reset voltage. After the integration period, the total number of electrons that represent a first color, such as blue, is defined to be the total number of electrons collected by n-type region 212C. In addition, the total number of electrons that represent a second color, such as green, is defined to be the total number of electrons collected by n-type region 212B less the total number of electrons collected by n-type region 212C.

Further, the total number of electrons that represent a third color, such as red, is defined to be the total number of electrons collected by n-type region 212A less the total number of electrons collected by n-type region 212B. The first, second, and third colors can be determined using, for example, differential amplifiers that are in line with each photodiode or photodiode pair. Thus, in accordance with the present invention, a number of colors, such as red, green, and blue, can be captured by an imager without the use of color filters.

One of the advantages of the present invention is that the present invention is fully compatible with standard CMOS fabrication processes. As a result, the present invention provides a color filter at no cost while at the same time saving the costs associated with forming color filters.

Figure 3:
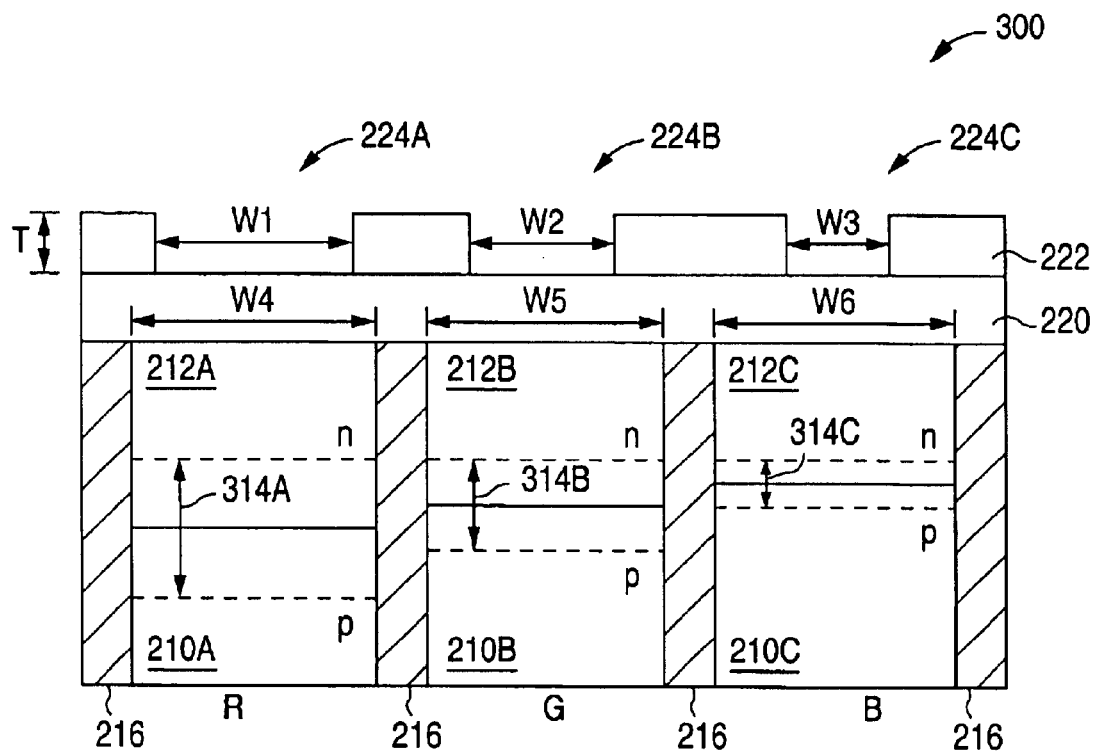
FIG. 3 is a cross-sectional diagram illustrating an example of a color imager 300 in accordance with an alternate embodiment of the present invention.

FIG. 3 shows a cross-sectional view that illustrates an example of a color imager 300 in accordance with an alternate embodiment of the present invention. Imager 300 is similar to imager 200 and, as a result, utilizes the same reference numerals to designate the structures which are common to both imagers.

As shown in FIG. 3, imager 300 differs from imager 200 in that imager 300 has a depletion region 314A that corresponds with the absorption depth of a first range of light, such as red, green, and blue light, a depletion region 314B that corresponds with the absorption depth of a second range of light, such as green and blue light, and a depletion region 314C that corresponds with the absorption depth of a third range of light, such as blue light. Imager 300 operates the same as imager 200.

One advantage of imager 300 over imager 200 is that metal layer 222 and widths W4, W5, and W6 of imager 300 can be smaller than in imager 200. This is because, as shown in FIG. 3, depletion region 314B is shallower than depletion region 314A. As a result, non-normal incident light that passes through the opening of one color can pass below and not be picked up by the depletion region that lies vertically below the opening of another color.

Figure 4:
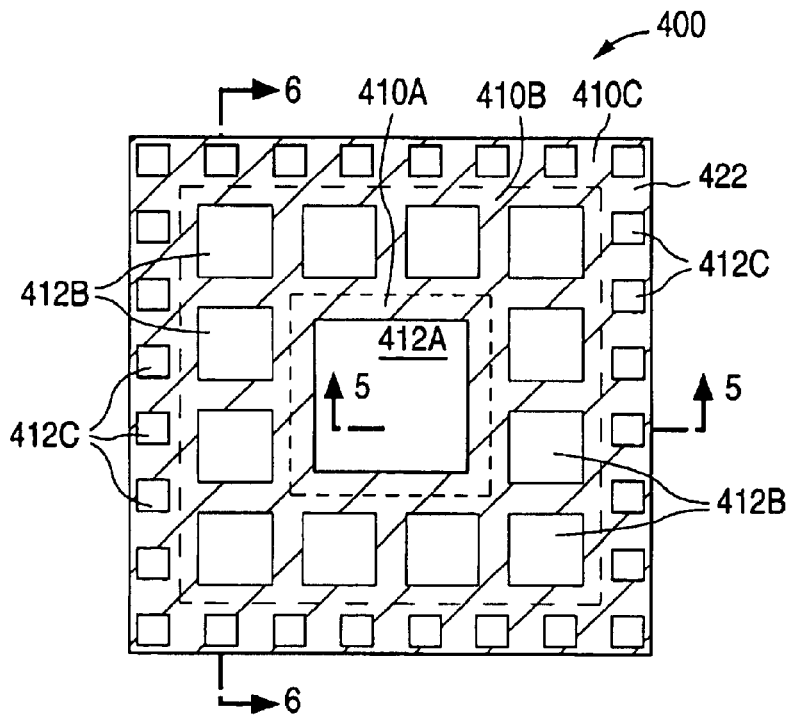
FIG. 4 is a plan view illustrating an example of a color imager 400 in accordance with the present invention.
Figure 5:
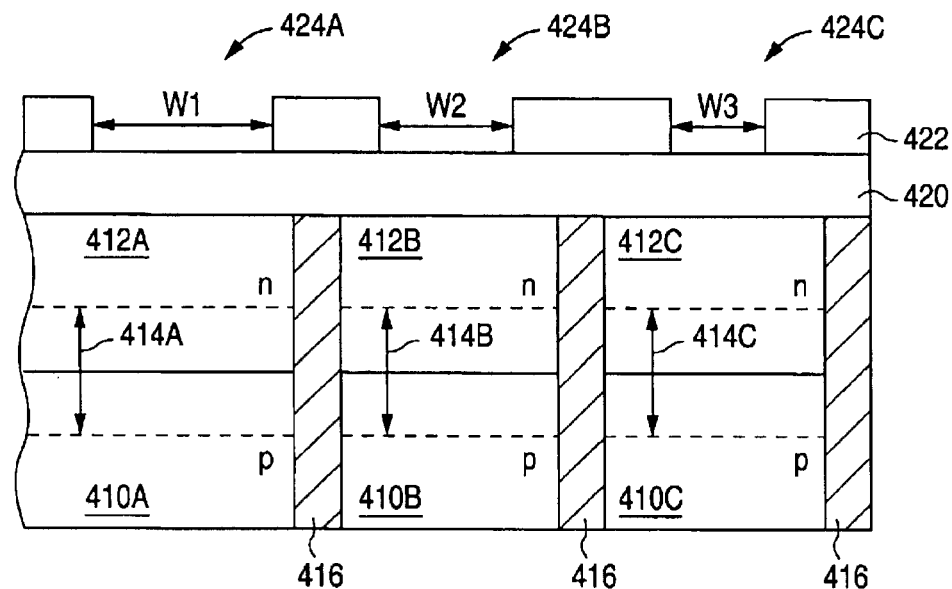
FIG. 5 is a cross-sectional diagram taken along line 5—5 of FIG. 4 in accordance with the present invention.
Figure 6:
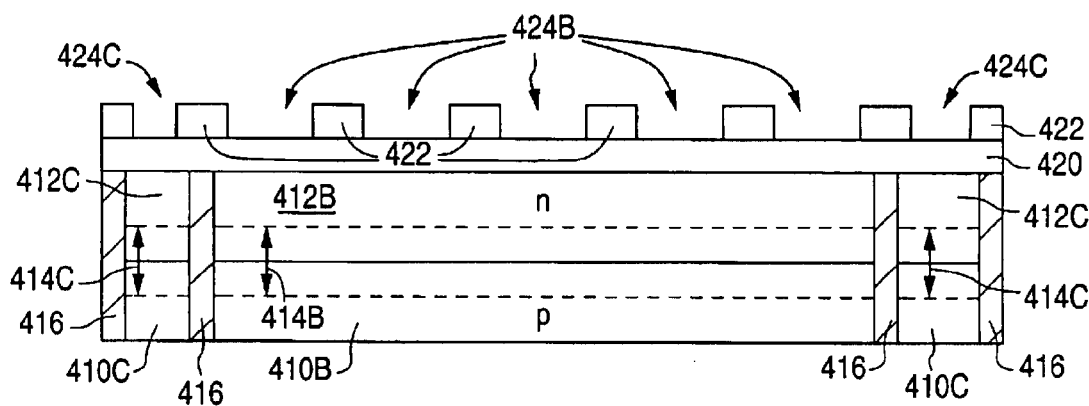
FIG. 6 is a cross-sectional diagram taken along line 6—6 of FIG. 4 in accordance with the present invention.

FIG. 4 shows a plan view that illustrates an example of a color imager 400 in accordance with the present invention. FIG. 5 is a cross-sectional diagram taken along line 5—5 of FIG. 4 in accordance with the present invention. FIG. 6 is a cross-sectional diagram taken along line 6—6 of FIG. 4 in accordance with the present invention.

As shown in FIGS. 4, 5, and 6, color imager 400 includes a lightly-doped, p-type semiconductor region that has a first p-type region 410A, a second p-type region 410B that laterally surrounds p-type region 410A, and a third p-type region 410C that laterally surrounds p-type region 410B.

Imager 400 also includes an overlying n-type region that has a first n-type region 412A that contacts p-type region 410A, a second n-type region 412B that contacts p-type region 410B and laterally surrounds n-type region 412A, and a third n-type region 412C that contacts p-type region 410C and laterally surrounds n-type region 412B.

In addition, imager 400 includes a first depletion region 414A that is formed across the pn junction of p-type region 410A and n-type region 412A, a second depletion region 414B that is formed across the pn junction of p-type region 410B and n-type region 412B, and a third depletion region 414C that is formed across the pn junction of p-type region 410C and n-type region 412C.

Further, imager 400 includes a number of trench isolation regions 416 that are formed between, and isolate, the first p-type and n-type regions 410A and 412A, the second p-type and type regions 410B and 412B, and the third p-type and n-type regions 410C and 412C from each other.

Imager 400 also includes a layer of isolation material 420 that is formed on n-type regions 412A, 412B, and 412C, and a layer of metal 422 that is formed on isolation material 420. In accordance with the present invention, metal layer 422 includes a first opening 424A that has a first width W1 approximately equal to the wavelength of red light, a second opening 424B that has a second width W2 approximately equal to the wavelength of green light, and a third opening 424C that has a third width W3 approximately equal to the wavelength of blue light.

As above, metal layer 422 has a thickness and widths that are sufficient to prevent incident light, which is non-normal to the top surface of metal layer 422, from passing through the opening of one color and being picked up by the depletion region that lies vertically below the opening of another color.

First, second, and third openings 424A, 424B, and 424C ideally have a round shape when seen from a plan view, where the widths W1, W2, and W3 are diameters. Alternately, first, second, and third openings 424A, 424B, and 424C can have a square shape when seen from a plan view. Least desirable is a rectangular-shaped opening unless polarized light is desired.

Figure 7:
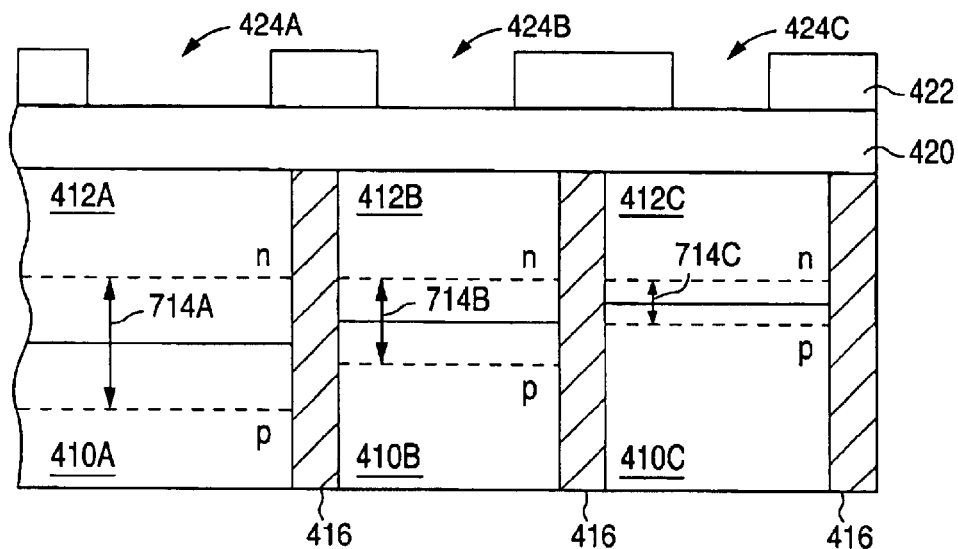
FIG. 7 is a cross-sectional view taken along line 5—5 of FIG. 4 illustrating an example of a color imager 700 in accordance with an alternate embodiment of the present invention.
Figure 8:
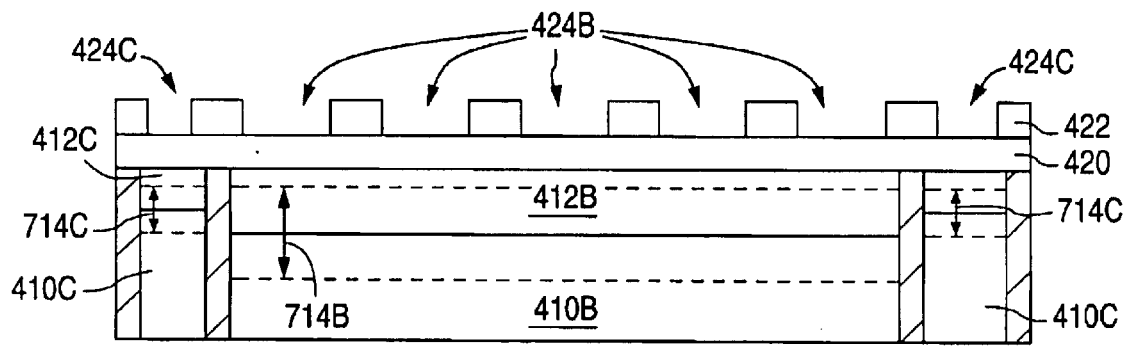
FIG. 8 is a cross-sectional diagram of imager 700 taken along line 6—6 of FIG. 4 in accordance with the alternate embodiment of the present invention.

FIG. 7 shows a cross-sectional view taken along line 5—5 of FIG. 4 that illustrates an example of a color imager 700 in accordance with an alternate embodiment of the present invention. FIG. 8 shows a cross-sectional diagram of imager 700 taken along line 6—6 of FIG. 4 in accordance with the alternate embodiment of the present invention. Imager 700 is similar to imager 400 and, as a result, utilizes the same reference numerals to designate the structures which are common to both imagers.

As shown in FIGS. 7 and 8, imager 700 differs from imager 400 in that imager 700 has a depletion region 714A that corresponds with the absorption depth of a first range of light, such as red, green, and blue light, a depletion region 714B that corresponds with the absorption depth of a second range of light, such as green and blue light, and a depletion region 714C that corresponds with the absorption depth of a third range of light, such as blue light.

Figure 9A:
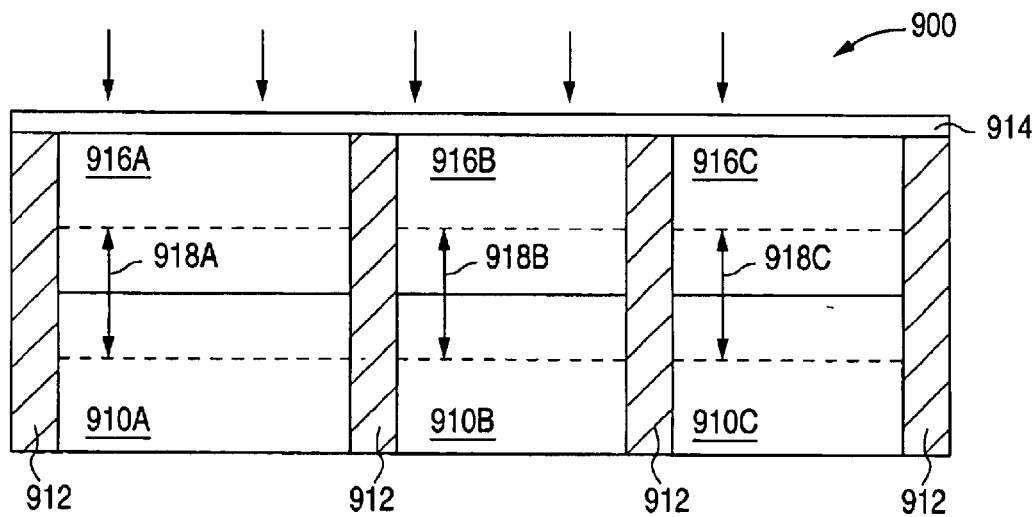
FIGS. 9A–9C are cross-sectional diagrams illustrating an example of a method of forming a color imager in accordance with the present invention.
Figure 9B:
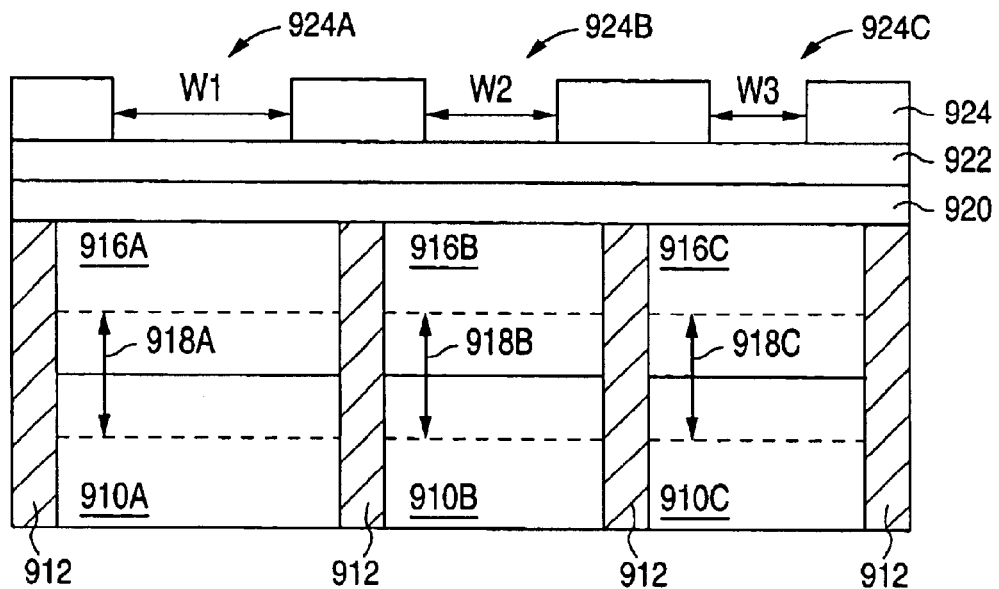
Figure 9C:
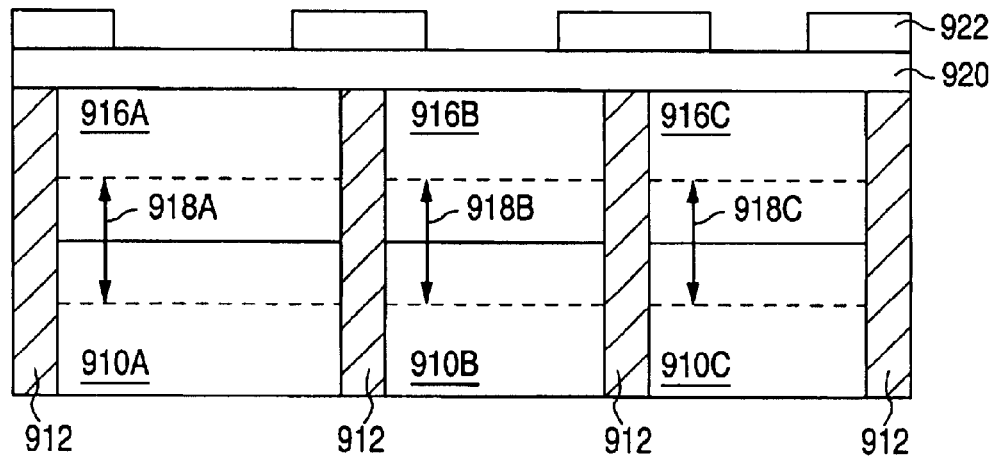

FIGS. 9A–9C show cross-sectional diagrams that illustrate an example of a method of forming a color imager in accordance with the present invention. As shown in FIG. 9A, the method utilizes a conventionally-formed wafer 900 that has lightly-doped, p-type region that has a first p-type region 910A, a second p-type region 910B, and a third p-type region 910C. Wafer 900 also includes a number of trench isolation regions 912 that are formed between, and isolate, the first p-type region 910A, the second p-type regions 910B, and the third p-type region 910C from each other.

As further shown in FIG. 9A, the method begins by forming a layer of sacrificial oxide 914 on p-type regions 910A, 910B, and 910C. Following this, wafer 900 is implanted with an n-type material to form an overlying n-type region that has a first n-type region 916A that contacts p-type region 910A, a second n-type region 916B that contacts p-type region 910B, and a third n-type region 916C that contacts p-type region 910C. (Peripheral regions of wafer 900 which are not to receive the implant are masked in a conventional manner before the implant.) Sacrificial layer 914 is removed.

The implant forms a first depletion region 918A that is formed across the pn junction of p-type region 910A and n-type region 916A, a second depletion region 918B that is formed across the pn junction of p-type region 910B and n-type region 916B, and a third depletion region 918C that is formed across the pn junction of p-type region 910C and n-type region 916C.

Next, as shown in FIG. 9B, a layer of isolation material 920 is formed on n-type regions 916A, 916B, and 916C, followed by the formation of a layer of metal 922 on isolation material 920. After this, a metal mask 924 is formed and patterned on metal layer 922. In accordance with the present invention, mask 924 has a first opening 924A that has a first width W1 approximately equal to the wavelength of red light, a second opening 924B that has a second width W2 approximately equal to the wavelength of green light, and a third opening 924C that has a third width W3 approximately equal to the wavelength of blue light.

First, second, and third openings 924A, 924B, and 924C ideally have a round shape when seen from a plan view, where the widths W1, W2, and W3 are diameters. Alternately, first, second, and third openings 924A, 924B, and 924C can have a square shape when seen from a plan view. Least desirable is a rectangular-shaped opening unless polarized light is desired.

Following this, as shown in FIG. 9C, the exposed regions of metal layer 922 are etched until the exposed regions of metal layer 922 are removed from the top surface of the isolation layer 920 to form openings 926A, 926B, and 926C. After the etch, metal mask 924 is removed. The method then continues with convention steps.

Figure 10A:
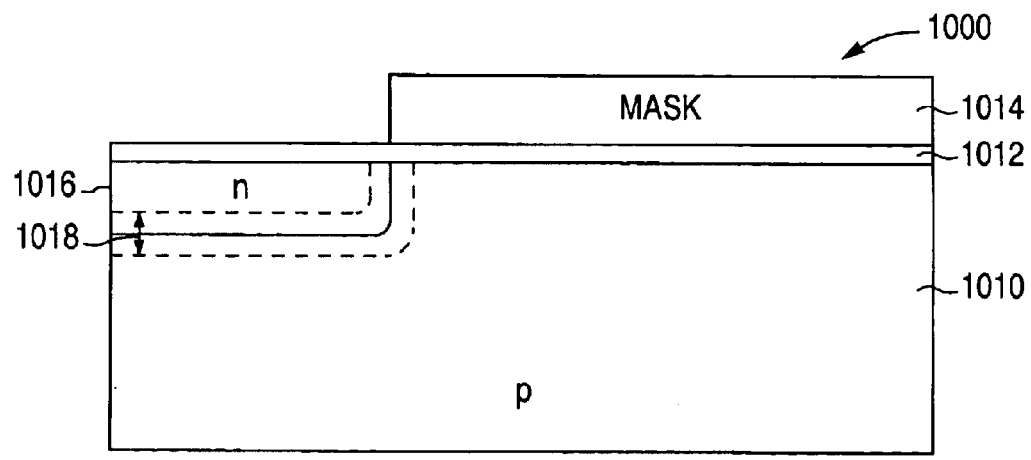
FIGS. 10A–10D are cross-sectional diagrams illustrating an example of a method of forming a color imager in accordance with an alternate embodiment of the present invention.

FIGS. 10A–10D show cross-sectional diagrams that illustrate an example of a method of forming a color imager in accordance with an alternate embodiment of the present invention. As shown in FIG. 10A, the method utilizes a conventionally-formed wafer 1000 that has a lightly-doped, p-type region 1010.

As further shown in FIG. 10A, the method begins by forming a layer of sacrificial oxide 1012 on p-type region 1010. Following this, a first implant mask 1014 is formed and patterned on oxide layer 1012. Wafer 1000 is then implanted with an n-type material to form a first n-type region 1016 that contacts p-type region 1010. The implant forms a first depletion region 1018 that is formed across the pn junction of p-type region 1010 and n-type region 1016. Following the implant, first implant mask 1014 is removed.

Figure 10B:
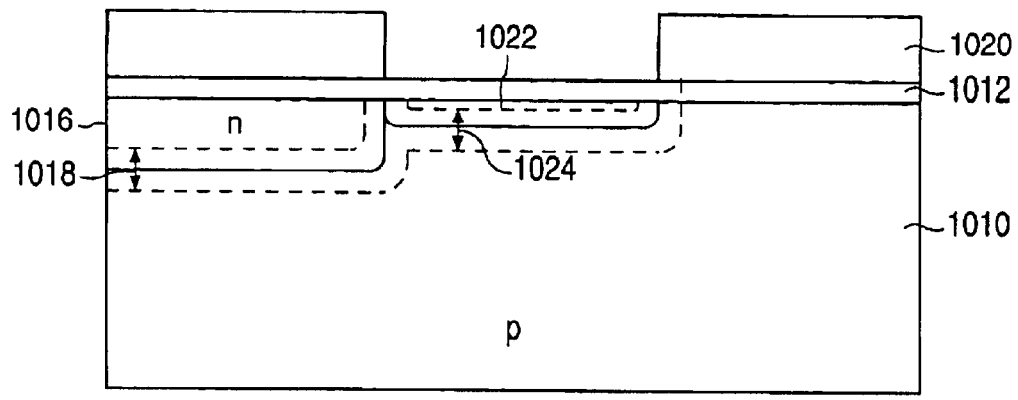

Next, as shown in FIG. 10B, a second implant mask 1020 is formed and patterned on oxide layer 1012. Wafer 1000 is then implanted with an n-type material to form a second n-type region 1022 that contacts p-type region 1010A. The implant, which is shallower than the previous implant, forms a second depletion region 1024 that is formed across the pn junction of p-type region 1010 and n-type region 1022. Second implant mask 1020 is then removed, followed by the removal of sacrificial layer 1012.

Figure 10C:
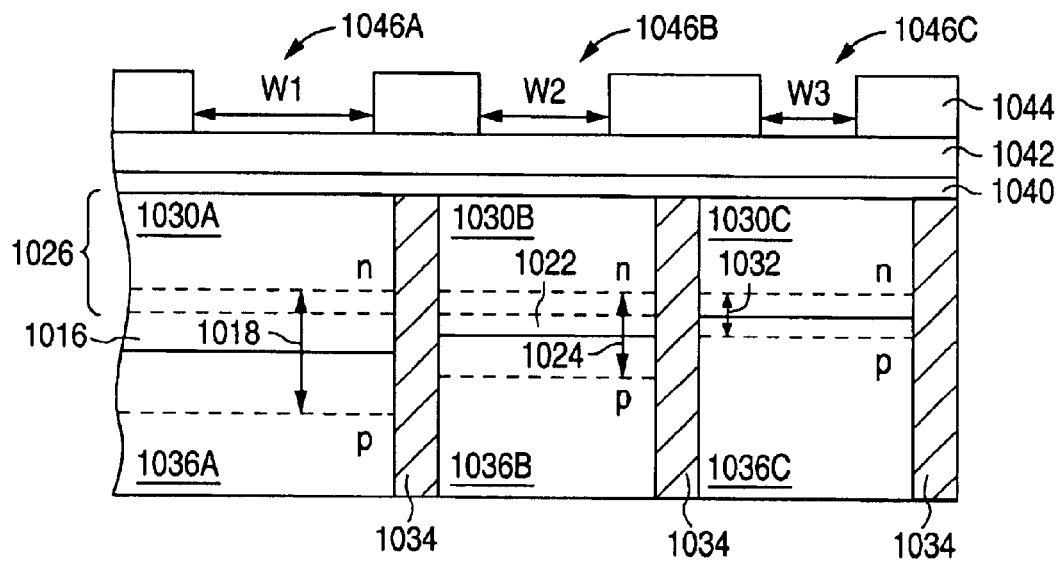

After this, as shown in FIG. 10C, an n-type layer 1026 is epitaxially formed on n-type region 1016, n-type region 1022, and p-type region 1010. N-type layer 1026 combined with n-type region 1016 forms a first n-type region 1030A, n-type layer 1026 combined with n-type region 1022 forms a second n-type region 1030B, and n-type layer 1026 formed over p-type region 1010 forms a third n-type region 1030C. The epitaxial growth forms a third depletion region 1032 that is formed across the pn junction of p-type region 1010 and n-type region 1026.

Next, a number of trench isolation regions 1034 are formed using conventional trench formation techniques. The trench isolation regions 1034 form a first p-type region 1036A that contacts n-type region 1030A, a second p-type region 1036B that contacts n-type region 1030B, and a third p-type region 1036C that contacts n-type region 1030C.

Following this, a layer of isolation material 1040 is formed on n-type regions 1030A, 1030B, and 1030C, followed by the formation of a layer of metal 1042 on isolation material 1040. After this, a metal mask 1044 is formed and patterned on metal layer 1042. In accordance with the present invention, mask 1044 has a first opening 1046A that has a first width W1 approximately equal to the wavelength of red light, a second opening 1046B that has a second width W2 approximately equal to the wavelength of green light, and a third opening 1046C that has a third width W3 approximately equal to the wavelength of blue light.

First, second, and third openings 1046A, 1046B, and 1046C ideally have a round shape when seen from a plan view, where the widths W1, W2, and W3 are diameters. Alternately, first, second, and third openings 1046A, 1046B, and 1046C can have a square shape when seen from a plan view. Least desirable is a rectangular-shaped opening unless polarized light is desired.

Figure 10D:
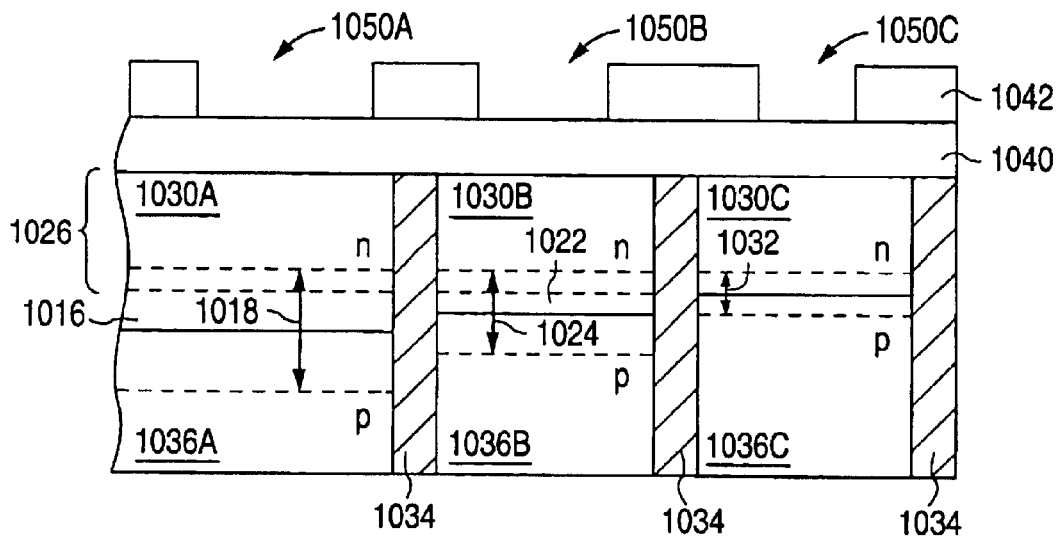

Following this, as shown in FIG. 10D, the exposed regions of metal layer 1042 are etched until the exposed regions of metal layer 1042 are removed from the top surface of the isolation layer 1040 to form openings 1050A, 1050B, and 1050C. After the etch, metal mask 1044 is removed. The method then continues with convention steps.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a color imager in a first semiconductor region of a first conductivity type, the method comprising the steps of:

forming a second semiconductor region of a second conductivity type over the first semiconductor region;

forming a layer of isolation material on the second semiconductor region;

forming a layer of metal over the layer of isolation material over the second semiconductor region; and etching the layer of metal to form a plurality of openings in the layer of metal, the plurality of openings including a first opening that vertically lies over a first pn junction region, a second opening that vertically lies over a second pn junction region, and a third opening that vertically lies over a third pn junction region, the layer of metal being electrically isolated from the first and second semiconductor regions.

2. The method of claim 1 wherein the first, second, and third openings have different widths.

3. A method of forming a color imager in a first semiconductor region of a first conductivity type, the method comprising the steps of:

forming a second semiconductor region of a second conductivity type over the first semiconductor region;

forming a layer of metal over the second semiconductor region; and etching the layer of metal to form a plurality of openings in the layer of metal, the plurality of openings including a first opening that vertically lies over a first pn junction, a second opening that vertically lies over a second pn junction, and a third opening that vertically lies over a third pn junction, the first opening having a first width approximately equal to a first wavelength of light, the second opening having a second width approximately equal to a second wavelength of light, and the third opening having a third width approximately equal to a third wavelength of light, the first, second, and third widths being different.

4. The method of claim 3 wherein the first wavelength of light is red light, the second wavelength of light is green light, and the third wavelength of light is blue light.

5. The method of claim 1 and further including the step of forming an insulation region in the second semiconductor region, the insulation region laterally isolating the first pn junction from the second pn junction.

6. The method of claim 1 wherein:
the second semiconductor region has a top surface; and
the first pn junction, the second pn junction, and the third pn junction lie at substantially equal distances below the top surface of the second semiconductor region.

7. The method of claim 1 wherein:
the second semiconductor region has a top surface; and
the first pn junction, the second pn junction, and the third pn junction lie at substantially different distances below the top surface of the second semiconductor region.

8. The method of claim 1 wherein the step of forming the second semiconductor region includes the steps of:
forming a mask over the first semiconductor region; and
implanting the first semiconductor region with a dopant to form the second semiconductor region.

9. The method of claim 8 and further comprising the step of repeating the forming a mask and implanting steps a plurality of times to form the second semiconductor region.

10. The method of claim 3 and further including the step of forming an insulation region in the second semiconductor region, the insulation region laterally isolating the first pn junction from the second pn junction.

11. The method of claim 3 wherein:
the second semiconductor region has a top surface; and
the first pn junction, the second pn junction, and the third pn junction lie at substantially equal distances below the top surface of the second semiconductor region.

12. The method of claim 3 wherein:
the second semiconductor region has a top surface; and
the first pn junction, the second pn junction, and the third pn junction lie at substantially different distances below the top surface of the second semiconductor region.

13. The method of claim 3 wherein the step of forming the second semiconductor region includes the steps of:
forming a mask over the first semiconductor region; and
implanting the first semiconductor region with a dopant to form the second semiconductor region.

14. The method of claim 13 and further comprising the step of repeating the forming a mask and implanting steps a plurality of times to form the second semiconductor region.

15. A method of forming a color imager in a first semiconductor region of a first conductivity type, the method comprising the steps of:
forming a plurality of second semiconductor regions of a second conductivity type over the first semiconductor region, the plurality of second semiconductor regions having a plurality of pn junctions that lie between the plurality of second semiconductor regions and the first semiconductor region, each second semiconductor region having a top surface;
forming a layer of insulation material that contacts the second semiconductor regions;
forming a layer of metal over the layer of insulation material; and
etching the layer of metal to form a plurality of spaced-apart openings of different widths in the layer of metal, the openings lying over the plurality of second semiconductor regions, the layer of metal lying between two adjacent openings being electrically isolated from the second semiconductor regions that lie below the two adjacent openings.

16. The method of claim 15 and further comprising the step of forming an insulation region in the second semiconductor region, the insulation region laterally isolating the plurality of second semiconductor regions.

17. The method of claim 15 wherein the plurality of pn junctions lie at substantially equal distances below the top surfaces of the second semiconductor regions.

18. The method of claim 15 wherein the plurality of pn junctions lie at substantially different distances below the top surfaces of the second semiconductor regions.

19. The method of claim 15 wherein the step of forming the second semiconductor region includes the steps of:
forming a mask over the first semiconductor region; and
implanting the first semiconductor region with a dopant to form a second semiconductor region.

20. The method of claim 15 wherein the plurality of openings includes a first opening that has a first width approximately equal to a first wavelength of light, a second opening that has a second width approximately equal to a second wavelength of light, and a third opening that has a third width approximately equal to a third wavelength of light, the first, second, and third widths being different.

* * * * *

UNITED STATES PATENT AND TRADEMARK OFFICE
CERTIFICATE OF CORRECTION

PATENT NO. : 6,852,562 B1
DATED : February 8, 2005
INVENTOR(S) : Peter J. Hopper et al.

It is certified that error appears in the above-identified patent and that said Letters Patent is hereby corrected as shown below:

Column 10,
Lines 18-19, after "plurality of," delete "spaced-apart".

Signed and Sealed this

First Day of November, 2005

JON W. DUDAS
*Director of the United States Patent and Trademark Office*